(12) United States Patent
Yamazaki et al.

(10) Patent No.: US 6,620,528 B1
(45) Date of Patent: Sep. 16, 2003

(54) EL DISPLAY DEVICE AND A METHOD OF MANUFACTURING THE SAME

(75) Inventors: Shunpei Yamazaki, Tokyo (JP); Tetsuo Tsutsui, Fukuoka (JP); Mayumi Mizukami, Kanagawa (JP)

(73) Assignee: Semiconductor Energy Laboratory Co., Ltd, Kanagawa-ken (JP)

( * ) Notice: Subject to any disclaimer, the term of this patent is extended or adjusted under 35 U.S.C. 154(b) by 0 days.

(21) Appl. No.: 09/619,485

(22) Filed: Jul. 19, 2000

(30) Foreign Application Priority Data

Jul. 23, 1999 (JP) .......................................... 11-209203

(51) Int. Cl.⁷ .............................................. H05B 33/14
(52) U.S. Cl. ...................... 428/690; 428/917; 313/506; 257/101; 257/102; 257/103; 252/301.33
(58) Field of Search ................................ 428/690, 917; 313/502, 503, 504, 505, 506; 257/101, 102, 103; 252/301.33, 299.2

(56) References Cited

U.S. PATENT DOCUMENTS

| | | | |
|---|---|---|---|
| 4,885,211 A | * 12/1989 | Tang et al. ................. 428/457 |
| 5,047,687 A | * 9/1991 | VanSlyke .................... 313/503 |
| 5,281,489 A | * 1/1994 | Mori et al. ................. 428/690 |
| 5,641,991 A | 6/1997 | Sakoh | |
| 5,684,365 A | 11/1997 | Tang et al. | |
| 5,882,761 A | 3/1999 | Kawami et al. ............... 428/69 |
| 5,949,186 A | 9/1999 | Nagayama et al. | |
| 6,064,151 A | * 5/2000 | Choong et al. .............. 313/504 |
| 6,114,088 A | 9/2000 | Wolk et al. | |
| 6,137,223 A | * 10/2000 | Hung et al. ................. 313/506 |
| 6,169,359 B1 | * 1/2001 | Sun et al. ................... 313/503 |
| 6,188,134 B1 | 2/2001 | Stumborg et al. | |
| 6,221,701 B1 | 4/2001 | Yamazaki | |
| 6,259,138 B1 | 7/2001 | Ohtani et al. | |
| 6,278,236 B1 | 8/2001 | Madathil et al. | |
| 6,281,627 B1 | * 8/2001 | Arai et al. ................... 313/506 |

FOREIGN PATENT DOCUMENTS

| | | |
|---|---|---|
| EP | 717445 | 6/1996 |
| EP | 0 776 147 A1 | 5/1997 |
| JP | 08-078519 | 3/1996 |
| JP | 08-241048 | 9/1996 |
| JP | 9-148066 | 6/1997 |

OTHER PUBLICATIONS

Takeki Kofuji, "Development of Organic EL Element to Single Layer Type", Electronic Journal 6th FPD Seminar, Jun. 29, 1999, pp. 83–88.

(List continued on next page.)

*Primary Examiner*—Cynthia H. Kelly
*Assistant Examiner*—Dawn Garrett
(74) *Attorney, Agent, or Firm*—Eric J. Robinson; Robinson Property Law Office, P.C.

(57) ABSTRACT

To provide an inexpensive EL display device of high definition. An anode, a light emitting layer, and a cathode are formed on a substrate, and selective doping using at least one selected from the group consisting of an alkali metal element, an alkaline earth metal element and a halogen element is then performed to form at least ones of electron transmitting regions and hole transmitting regions. In such a structure, only a part of the light emitting layer, where at least ones of the electron transmitting regions and the hole transmitting regions are formed, emits light when a given voltage is applied to the light emitting layer, whereby images are displayed as desired.

40 Claims, 5 Drawing Sheets

OTHER PUBLICATIONS

Tsutsui et al., "Electroluminescence in Organic Thin Films", Photochemical Processes in Organized Molecular Systems, 1991, pp. 437–450.

Baldo et al., "Very High–Efficiency Green Organic Light–Emitting Devices Based on Electrophosphorescence", Applied Physics Letters, vol. 75, No. 1, Jul. 5, 1999, pp. 4–6.

Baldo et al., "Highly Efficient Phosphorescent Emission From Organic Electroluminescent Devices", Nature vol. 395, Sep. 10, 1998, pp. 151–154.

Tsutsui et al., High Quantum Efficiency in Organic Light–Emitting Devices with Iridium–Complex as a Triplet Emissive Center, Japanese Journal of Applied Physics, vol. 38, Part 12B, Dec. 15, 1999, pp. L1502–L1504.

Related Application U.S. patent application Ser. No. 09/615,264 "EL Display Device And A Method of Manufacturing The Same," filed Jul. 13, 2000.

Related Application U.S. patent application Ser. No. 09/815,661 "Method of Manufacturing A Light Emitting Device," filed Mar. 23, 2001.

* cited by examiner

EL DISPLAY DEVICE AND A METHOD OF MANUFACTURING THE SAME

BACKGROUND OF THE INVENTION

1. Field of the Invention

The present invention involves techniques relating to a display device comprising an EL (electro luminescence) element (hereinafter referred to as an EL display device) and to a display that uses the EL display device.

2. Description of the Related Art

Studies of EL display devices comprising EL elements as self-light emitting elements have flourished in recent years. In particular, organic EL display devices using organic materials for EL materials have held the attention. The organic EL display devices are also called organic EL displays (OELDs) or organic Light Emitting Diodes (OLEDs).

EL display devices are of self-light emitting type, unlike liquid crystal display devices, and therefore the view angle does not matter in the EL display devices, which forms one of their characteristics. That is, the EL display devices are more suitable for displays used outdoors than the liquid crystal display devices, presenting so many possible ways of their use.

EL elements have the structure in which one EL layer is sandwiched between a pair of electrodes. An EL layer usually has a layer structure. As a typical example thereof, a layer structure consisting of hole transmitting layer/light emitting layer/electron transmitting layer which has proposed by Tang, et al. from Kodak Eastman company can be named. This is so highly efficient in terms of light emission that most of EL display devices whose research and development is now under way employ that structure.

Light is emitted by applying a given voltage generated between the pair of electrodes to the EL layer having the above structure to cause re-combination of carriers in the light emitting layer. A method to achieve this is chosen from two options in which one is to form the EL layer between two kinds of stripe-like electrodes arranged perpendicular to each other (simple matrix method) and the other is to form the EL layer between pixel electrodes that are connected to TFTs and are arranged in matrix and opposite electrodes (active matrix method).

Both methods requires to form the EL layer on the electrodes that have been patterned out. The EL layer, however, is easily influenced and degraded by changes such as level differences, so that various kinds of contrivance are made to improve the flatness. This leads into a problem of complication of manufacturing process and, accordingly, an increase in production cost.

SUMMARY OF THE INVENTION

The present invention has been made in view of the problem above, and an object of the present invention is therefore to provide a method of manufacturing an EL display device of high definition by uncostly measures. Another object of the present invention is to provide an inexpensive electronic device having the EL display device as such.

According to the present invention, a light emitting region is distinguished from a non-light emitting region by a totally novel method which has not been found in prior art. Specifically, the novel method is a technique characterized in that a light emitting layer is selectively doped with a specific impurity element to cause selective light emission from the region doped with the impurity element. In this specification, the term specific impurity element means an impurity element that is capable of making the light emitting layer function as a hole transmitting layer (or a hole injection layer) or an electron transmitting layer (or an electron injection layer) when used to dope the light emitting layer.

The present invention includes three methods as follows: a first method is to dope into the vicinity of the interface between an anode and a light emitting layer with a specific impurity element, a second method is to dope into the vicinity of the interface between a cathode and a light emitting layer with a specific impurity element, and a third method is to dope into both the vicinity of the interface between the anode and the light emitting layer and the vicinity of the interface between the cathode and the light emitting layer with different specific impurity elements.

The first method is characterized in that the vicinity of the interface between the anode and the light emitting layer is doped with a halogen element as a specific impurity element, typically, F (fluorine), Cl (chlorine), B (bromine) or I (iodine). The vicinity of the interface between the anode and the light emitting layer refers to an extent 100 nm (50 nm, typically) down the depth of the light emitting layer from the interface between the anode and the light emitting layer. No trouble is caused if the halogen element is contained in the anode.

The second method is characterized in that the vicinity of the interface between the cathode and the light emitting layer is doped with, as a specific impurity element, an alkali metal element, typically, Li (lithium), Na (sodium), K (potassium) or Cs (cesium), or an alanine earth metal element, typically, Be (beryllium), Mg (magnesium), Ca (calcium) or Ba (barium). The vicinity of the interface between the cathode and the light emitting layer refers to an extent 100 nm (50 nm, typically) down the depth of the light emitting layer from the interface between the cathode and the light emitting layer. No trouble is caused if the alkali metal element or an alkaline earth metal element is contained in the cathode.

The third method is characterized in that it is a combination of the first method and the second method, and in that the vicinity of the interface between the anode and the light emitting layer is doped with a halogen element as a specific impurity element, while the vicinity of the interface between the cathode and the light emitting layer is doped with, as a specific impurity element, an alkali metal element or an alkalin earth metal element.

A known doping method suites the doping of the above specific impurity element. Ion doping that does not involve mass separation, ion implantation that involves mass separation, vapor phase doping that utilizes diffusion are preferable. Whichever method is used, it is whether the method allows selective doping of the above specific impurity element that matters.

According to the present invention, the vicinity of the interface between the anode, or the cathode, and the light emitting layer is selectively doped with a specific impurity element, and only the portion doped with the impurity element emits light when the voltage is applied. In other words, drive voltage of an EL element in the present invention is adjusted such that the light emitting layer emits no light by itself, or emits light of extremely low luminance. Further adjustment is made so that the portion doped with the specific impurity element emits light of satisfiable luminance at the same drive voltage.

That is, the present invention is characterized by doping the light emitting layer with a specific impurity element to use the doped portion as a hole transmitting layer or an electron transmitting layer in any of the first, second, and third methods. This makes a drive voltage, which is too low to cause substantial light emission of the light emitting layer by itself, sufficient for only the portion doped with the specific impurity element to emit light of satisfiable luminance.

DETAILED DESCRIPTION OF THE PREFERRED EMBODIMENT

Modes for carrying out the present invention will be described in detail with Embodiments shown below.

Embodiment 1

Figure 1A:
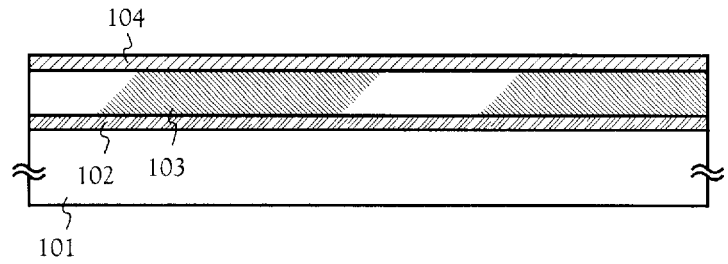
FIGS. 1A to 1C are diagrams showing a process of manufacturing an EL display device of Embodiment 1.

The constitution of this embodiment will be explained with reference to FIGS. 1A to 1C. First, a light transmitting substrate 101 is prepared, and an anode 102 made of a transparent conductive film, a light emitting layer 103, and a cathode 104 are formed sequentially. (FIG. 1A)

For the anode 102, any of a compound of indium oxide and tin oxide (hereinafter referred to as ITO or indium tin oxide), a compound of indium oxide and zinc oxide (hereinafter referred to as IZnO or indium zinc oxide), zinc oxide, and tin oxide may be used. The film thickness thereof may range from 80 nm to 200 nm (preferably, 100 to 150 nm).

The surface of the anode 102 is desirably irradiated with ultraviolet rays in an ozone atmosphere to remove organic or the like from the surface, before the light emitting layer 103 is formed. It is also desirable to completely remove moisture from the surface of the anode 102 by heat treatment.

If a low molecular-based material is used for the light emitting layer 103, a known technique such as evaporation, sputtering, and ion plating may be employed. In this case, to form the cathode 104 successively while keeping vacuum is preferable. A metallic film containing an alkali metal element or an alkaline earth metal element (typically, Mg—Ag film, Al—LiF film, etc.) is formed as the cathode to a thickness of 100 to 200 nm.

If a high molecular-based (polymer-based) material is used for the light emitting layer 103, a known technique such as spin coating, the ink jet method, and casting may be employed. Preferred in this case is that the light emitting layer is formed in a dry inert atmosphere and then the cathode 104 is formed without exposing the layer to the air (especially, moisture and oxygen).

The film thickness of the light emitting layer 103 may range from 30 nm to 200 nm (preferably 50 to 100 nm). Shown here is an example in which the light emitting layer 103 is directly formed on the anode 102, but a hole transmitting layer or a hole injection layer may be formed therebetween.

Resists 105a to 105e are then formed, and the vicinity of the interface between the light emitting layer 103 and the cathode 104 is selectively doped with a specific impurity element, in this embodiment, an alkali metal element or an alkaline earth metal element. Used here in Embodiment 1 as the specific impurity element is cesium.

A minute amount of cesium is sufficient for the doping. The concentration of cesium to be used for doping is typically $1\times10^{14}$ to $1\times10^{18}$ atoms/cm$^3$, preferably $1\times10^{15}$ to $1\times10^{17}$ atoms/cm$^3$. In practice, proper concentration varies depending also upon a material of the light emitting layer 103. It is therefore required for the operator to find out the optimal concentration in advance.

In this embodiment, a region doped with cesium extends, utmost, 50 nm down the depth of the light emitting layer from the interface between the light emitting layer 103 and the cathode 104. That is, regions denoted by 106a to 106d in FIG. 1B are regions serving as electron transmitting layers (or electron injection layers) (hereinafter referred to as electron transmitting regions).

Note that cesium is contained also in the cathode 104 though it seems as if only the light emitting layer is doped with cesium in the drawing. However, only the light emitting layer doped with cesium is considered as a region that substantially functions as the electron transmitting region.

After thus completing the doping of the specific impurity element, the resists 105a to 105e are removed and an auxiliary electrode 107 is formed on the cathode 104. A material mainly containing aluminum may be used to form the auxiliary electrode 107. The auxiliary electrode 107 functions as an assistive electrode that complements the thinness of the cathode 104 so as to lower the resistance. The auxiliary electrode 107 may also be deemed as a protective electrode, for it has a protective effect of preventing moisture or the like from penetrating into the light emitting layer.

More desirably, a silicon nitride film or a silicon oxide nitride (expressed as SiO$_x$N$_y$) film is formed as a passivation film on the auxiliary electrode 107.

Figure 1C:
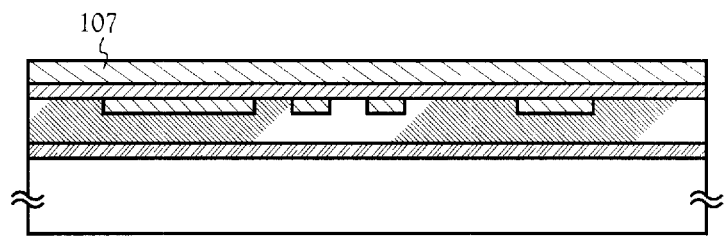
Figure 2:
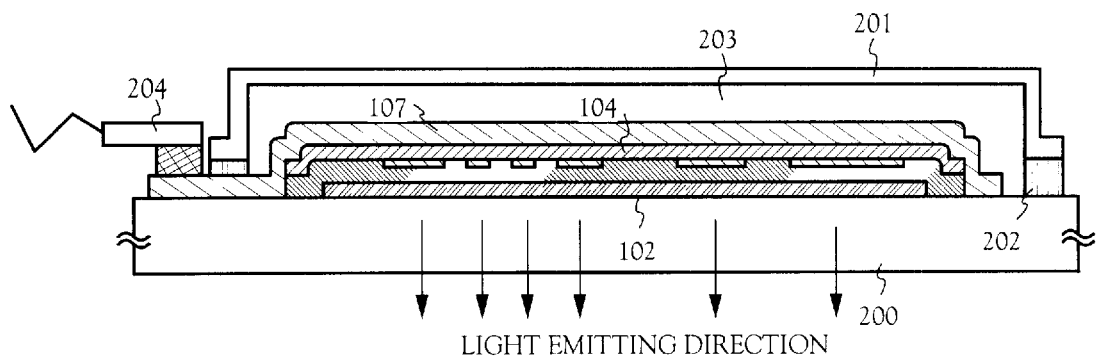
FIG. 2 is a diagram showing the sectional structure of an EL display device of Embodiment 1.

The EL display device is thus completed. In actuality, after the step illustrated in FIG. 1C, a sealing member (also called a housing member) 201 is put over the EL element (indicating here a capacitance element consisting of the anode, the light emitting layer and the cathode) to confine the EL element within a completely closed space. The containment is achieved by bonding the substrate 200 and the sealing member 201 with a sealing agent (or an adhesive) 202. (FIG. 2)

Structures in which an EL element is protected by a sealing member have already been known, and any of them may be employed. A drying agent (such as barium oxide) may be provided in a gap 203 formed between the sealing member and the EL element.

The anode 102 and the cathode 104 are led out the sealing member 201 and connected to an FPC (flexible printed circuit) 204. An external signal is input therefrom. It seems as though only the cathode 104 is led out in FIG. 2, but a look at another section will confirm that the anode 102 is also led out.

Figure 1B:
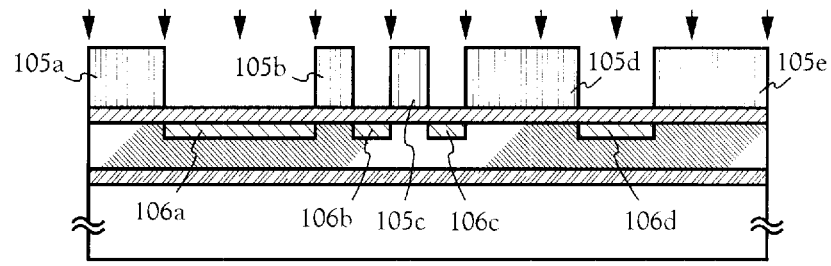

In the thus manufactured EL display device, only a part of the light emitting layer, where the electron transmitting regions 106a to 106d in FIG. 1B are formed, emits light when a given voltage is applied to the light emitting layer. The given voltage varies depending on a material of the light emitting layer and on the alkali metal element or the alkaline earth metal element used for the doping, and can be chosen within a range of from 3 to 10 V. Preferably, the contrast ratio of the luminance of emitted light is such that the luminance of the region doped with cesium is $10^3$ or more (more desirably, $10^4$ or more) times that of the not doped region.

Figure 3A:
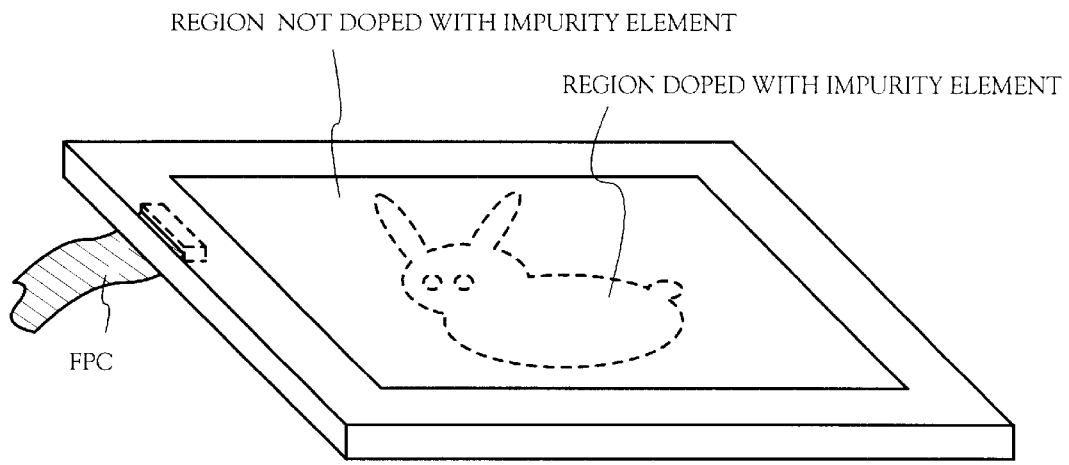
FIGS. 3A and 3B are diagrams illustrating image display by an EL display device of the present invention.
Figure 3B:
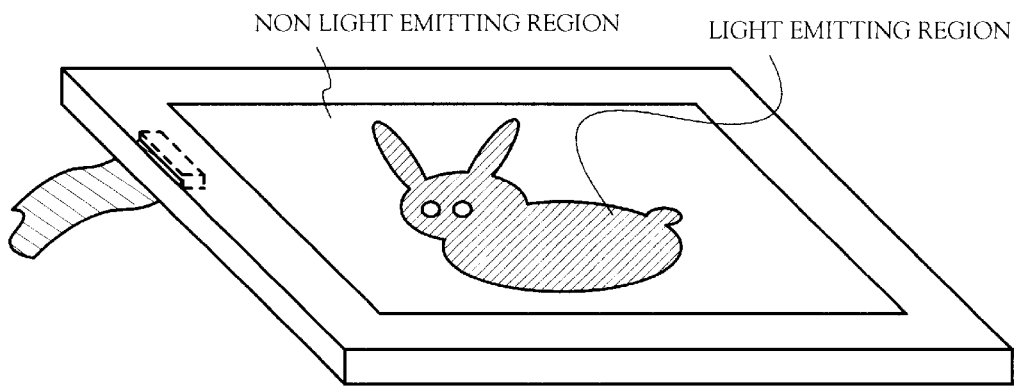

FIGS. 3A and 3B illustrate an outline of the light emission. FIG. 3A shows the state before the voltage is applied to the light emitting layer. In the drawing, inside a figure drawn by the dotted line is a region doped with an impurity element (cesium, in this embodiment), and a region surrounding the figure is a region that is not doped with the impurity element.

FIG. 3B shows the state after the voltage is applied to the light emitting layer. At this point, the region doped with the impurity element in FIG. 3A emits light to be recognized visually as a light emitting region. The region that is not doped with the impurity element in FIG. 3A does not emit light regardless of voltage application.

As described above, the light emitting layer is selectively doped with a specific impurity element (an alkali metal element or an alkaline earth metal element in this embodiment), and only the region doped with the specific impurity element emits light when the voltage is applied to the light emitting layer. Using the method according to the present invention, the patterning is required only once throughout the entire process. That is, there is no need to pattern the anode nor the cathode, which greatly simplifies the process and presents an advantage of low production cost.

In addition, the region emitting light (region doped with a specific impurity element) is defined through patterning, making it possible to display with high definition even extremely fine character pattern or figure pattern.

Embodiment 2

Figure 4A:
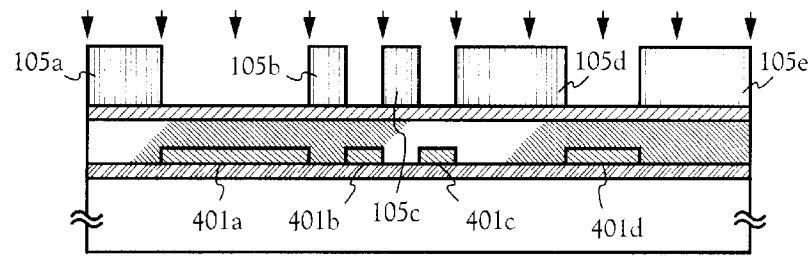
FIGS. 4A and 4B are diagrams showing a process of manufacturing an EL display device of Embodiment 2.
Figure 4B:
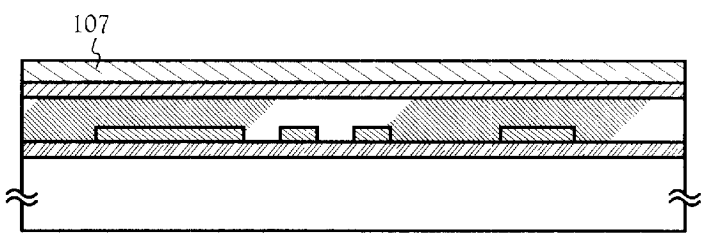

This embodiment gives a description with reference to FIGS. 4A and 4B on an example of separating a light emitting region from a non-light emitting region by measures different from that of Embodiment 1.

First, resists 105a to 105e are formed through the same steps as Embodiment 1. An electron transmitting layer or an electron injection layer may optionally be formed on a light emitting layer 103. This embodiment is characterized in that the vicinity of the interface between an anode 102 and the light emitting layer 103 is doped with a halogen element as a specific impurity element. Fluorine is used for the doping in Embodiment 2 as the halogen element.

A minute amount of fluorine is sufficient for the doping. The concentration of fluorine to be used for the doping is typically $1\times10^{14}$ to $1\times10^{18}$ atoms/cm$^3$, preferably $1\times10^{15}$ to $1\times10^{17}$ atoms/cm$^3$. In practice, proper concentration varies depending also upon a material of the light emitting layer 103. It is therefore required for the operator to find out the optimal concentration in advance.

In this embodiment, a region doped with fluorine extends, utmost, 70 nm down the depth of the light emitting layer from the interface between the light emitting layer 103 and the anode 102. That is, regions denoted by 401a to 401d in FIG. 4A are regions serving as hole transmitting layers (or hole injection layers) (hereinafter referred to as hole transmitting regions).

Note that fluorine is contained also in the anode 102 though it seems as if only the light emitting layer is doped with fluorine in the drawing. However, only the light emitting layer doped with fluorine is considered as a region that substantially functions as the hole transmitting region.

After thus completing the doping of the specific impurity element, the resists 105a to 105c are removed and an auxiliary electrode 107 is formed on the cathode 104. The description given in Embodiment 1 on the auxiliary electrode 107 applies to the auxiliary electrode 107 of this embodiment. As in Embodiment 1, a passivation film may of course be formed.

Thereafter, a substrate and a seating member is bonded together with a sealing agent and an FPC is attached, to thereby complete the EL display device having the structure shown in FIG. 2 (however, the structure of the light emitting layer differs). In the thus manufactured EL display device, only a part of the light emitting layer, where the hole transmitting regions 401a to 401d in FIG. 4A are formed, emits light when a given voltage is applied to the light emitting layer.

Embodiment 3

Figure 5A:
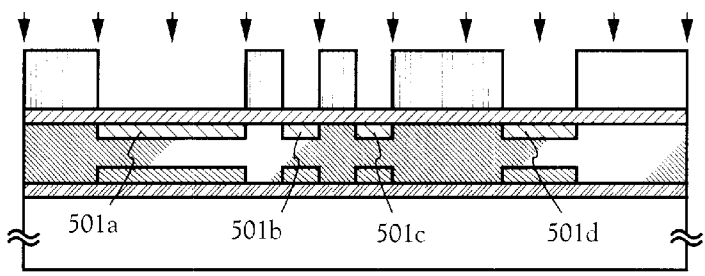
FIGS. 5A and 5B are diagrams showing a process of manufacturing an EL display device of Embodiment 3.
Figure 5B:
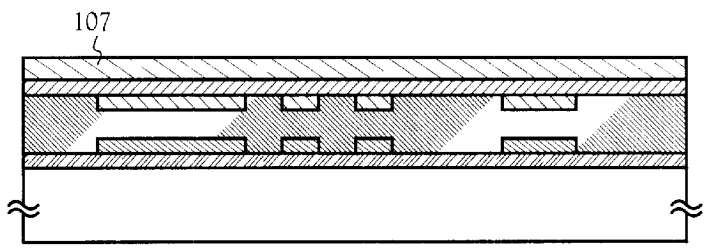

This embodiment gives a description with reference to FIGS. 5A and 5B on an example of separating a light emitting region from a non-light emitting region by measures different from that of Embodiment 1.

First, resists 105a to 105e are formed through the same steps as Embodiment 1. Hole transmitting regions (regions doped with a halogen element) 401a to 401d are formed in accordance with the steps of Embodiment 2.

Using the same resists 105a to 105e, electron transmitting regions (regions doped with an alkali metal element or an alkaline earth metal element) 501a to 501d are formed through steps similar to those in Embodiment 1. (FIG. 5A)

Embodiment 2 may be referred to for details of the doping step of the halogen element, while Embodiment 1 may be referred to for details of the doping step of the alkali metal element or the alkaline earth metal element.

After thus completing the doping of the halogen element and the alkali metal element, or the alkaline earth metal element, the resists 105a to 105e are removed and an auxiliary electrode 107 is formed on a cathode 104. The description given in Embodiment 1 on the auxiliary electrode 107 applies to the auxiliary electrode 107 of this embodiment. As in Embodiment 1, a passivation film may of course be formed.

Thereafter, a substrate and a sealing member is bonded together with a sealing agent and an FPC is attached, to thereby complete the EL display device having the structure shown in FIG. 2 (however, the structure of the light emitting layer differs). In the thus manufactured EL display device, only a part of the light emitting layer, where the hole transmitting regions 401a to 401d and the electron transmitting regions 501a to 501d are formed, emits light when a given voltage is applied to the light emitting layer.

Embodiment 4

Figure 6A:
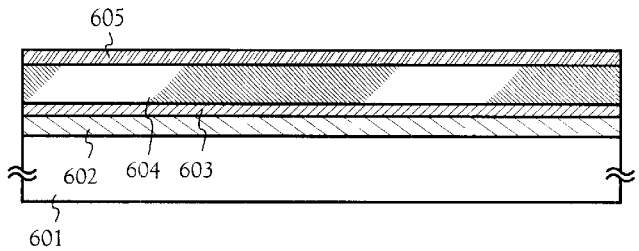
FIGS. 6A to 6C are diagrams showing a process of manufacturing an EL display device of Embodiment 4.
Figure 6B:
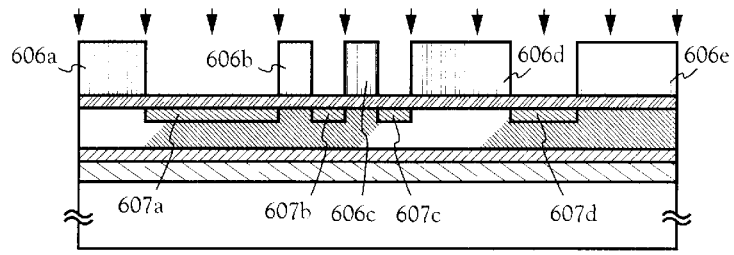
Figure 6C:
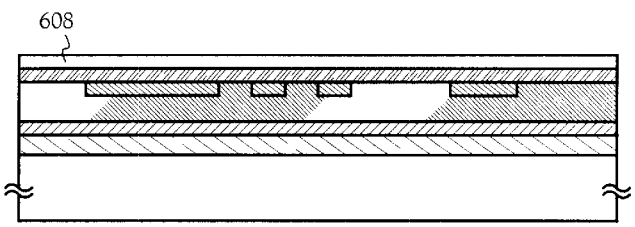

The constitution of this embodiment will be described with reference to FIGS. 6A to 6C. This embodiment relates to an EL display device having a structure in which light emitted from a light emitting layer exits from one side where the light does not transmit a substrate. First, a substrate 601 is prepared to sequentially form thereon an auxiliary electrode 602, a cathode 603, a light emitting layer 604, and anode 605. Embodiment 1 may be referred to for materials and formation methods of these layers. An electron transmitting layer or an electron injection layer may optionally be formed on the cathode 603 before the light emitting layer 604 is formed. (FIG. 6A)

Resists 606a to 606e are formed, and the next step is carried out to selectively dope the vicinity of the interface between the light emitting layer 604 and the anode 605 with a specific impurity element, a halogen element in this embodiment. Used here in Embodiment 4 as the specific impurity element is fluorine.

A minute amount of fluorine is sufficient for the doping. The concentration of fluorine to be used for the doping is, as in Embodiment 2, typically $1\times10^{14}$ to $1\times10^{18}$ atoms/cm$^3$, preferably $1\times10^{15}$ to $1\times10^{17}$ atoms/cm$^3$. In practice, proper concentration varies depending also upon a material of the light emitting layer 604. It is therefore required for the operator to find out the optimal concentration in advance.

In this embodiment, a region doped with fluorine extends, utmost, 70 nm down the depth of the light emitting layer from the interface between the light emitting layer 604 and the anode 605. That is, regions denoted by 607a to 607d in FIG. 6B are regions serving as hole transmitting regions.

Note that fluorine is contained also in the anode 605 though it seems as if only the light emitting layer is doped with fluorine in the drawing. However, only the light emitting layer doped with fluorine is considered as a region that substantially functions as the hole transmitting region.

After thus completing the doping of the specific impurity element, the resists 606a to 606e are removed and a passivation film 608 for protecting the anode 605 is formed. A silicon nitride film or a silicon oxide nitride film may be used for the passivation film 608. A silicon nitride oxide film having high transmittance is preferred, however, for the passivation film is to be arranged in a light path.

Thereafter, the substrate and a sealing member is bonded together with a sealing agent and an FPC is attached, to thereby complete the EL display device having the structure shown in FIG. 2 (however, the structure of the light emitting layer differs). In the thus manufactured EL display device, only a part of the light emitting layer, where the hole transmitting regions 607a to 607d are formed, emits light when a given voltage is applied to the light emitting layer.

Embodiment 5

Figure 7A:
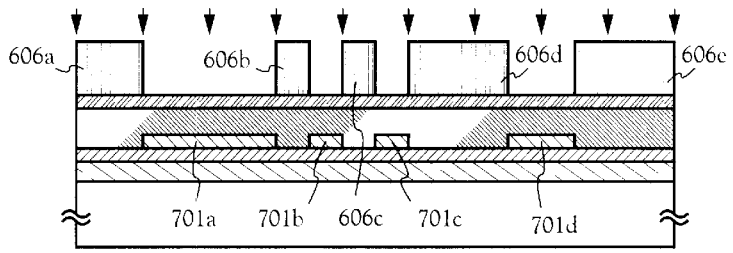
FIGS. 7A and 7B are diagrams showing a process of manufacturing an EL display device of Embodiment 5.
Figure 7B:
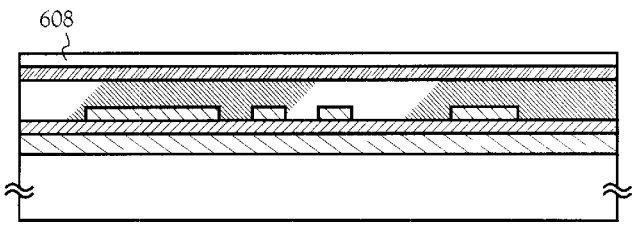

This embodiment gives a description with reference to FIGS. 7A and 7B on an example of separating a light emitting layer from a non-light emitting layer by measures different from the one described in Embodiment 4.

First, the state shown in FIG. 6A is obtained through the same steps as Embodiment 4. At this point, a hole transmitting layer or a hole injection layer may optionally be formed between a light emitting layer 604 and an anode 605. Then resists 606a to 606e are formed as shown in FIG. 6B.

The next step is carried out to selectively dope the vicinity of the interface between a cathode 603 and the light emitting layer 604 with a specific impurity element, an alkali metal element or an alkaline earth metal element in this embodiment. Used here in Embodiment 5 as the specific impurity element is potassium. (FIG. 7A)

The same amount of potassium as cesium in Embodiment 1 is sufficient for the doping. In this embodiment, a region doped with potassium extends, utmost, 30 nm down the depth of the light emitting layer from the interface between the cathode 603 and the light emitting layer 604. That is, regions denoted by 701a to 701d in FIG. 7A are regions serving as electron transmitting regions.

Note that potassium is contained also in the cathode 603 though it seems as if only the light emitting layer is doped with potassium in the drawing. However, only the light emitting layer doped with potassium is considered as a region that substantially functions as the electron transmitting region.

After thus completing the doping of the specific impurity element, the resists 606a to 606e are removed and a passivation film 608 for protecting the anode 605 is formed. As the passivation film 608, the same materials as Embodiment can be used. (FIG. 7B)

Thereafter, a substrate and a sealing member is bonded together with a sealing agent and an FPC is attached, to thereby complete the EL display device having the structure shown in FIG. 2 (however, the structure of the light emitting layer differs). In the thus manufactured EL display device, only a part of the light emitting layer, where the electron transmitting regions 701a to 701d are formed, emits light when a given voltage is applied to the light emitting layer.

Embodiment 6

Figure 8A:
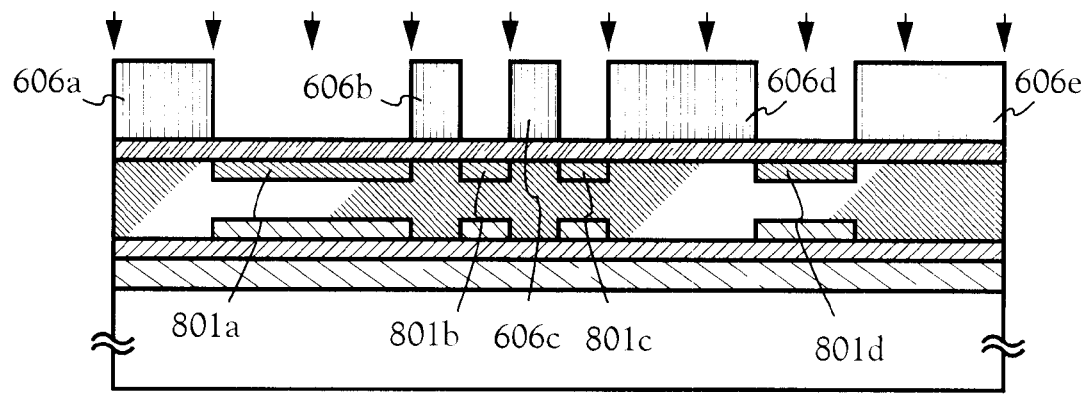
FIGS. 8A and 8B are diagrams showing a process of manufacturing an EL display device of Embodiment 6.
Figure 8B:
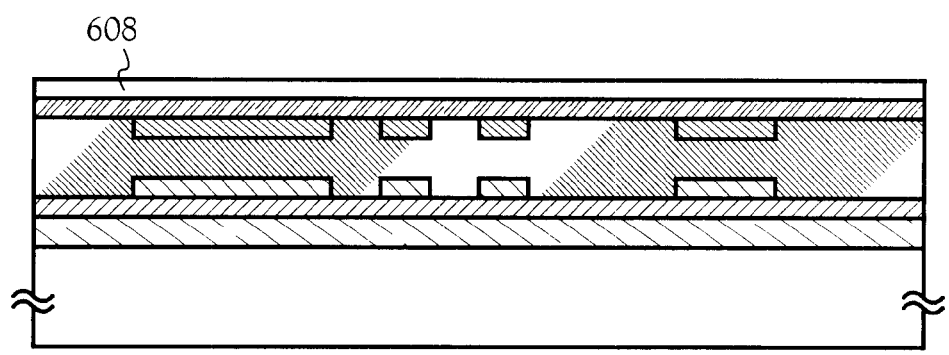

This embodiment gives a description with reference to FIGS. 8A and 8B on an example of separating a light emitting layer from a non-light emitting layer by measures different from the one described in Embodiment 4.

First, resists 606a to 606e are formed through the same steps as Embodiment 4. Electron transmitting regions (regions doped with an alkali metal element or an alkaline earth metal element) 701a to 701d are formed in accordance with the steps of Embodiment 5. Potassium is used in doping in this embodiment.

Using the same resists 606a to 606e, hole transmitting regions (regions doped with a halogen element) 801a to 801d are formed through steps similar to those in Embodiment 4. Fluorine is used for doping in this embodiment. (FIG. 8A)

Embodiment 2 may be referred to for detail of the doping step of the halogen element, while Embodiment 1 may be referred to for details of the doping step of the alkali metal element or the alkaline earth metal element.

After thus completing the doping of the specific impurity elements, the resists 606a to 606e are removed and a passivation film 608 for protecting the anode 605 is formed. (FIG. 8B)

Thereafter, a substrate and a sealing member is bonded together with a sealing agent and an FPC is attached, to thereby complete the EL display device having the structure shown in FIG. 2 (however, the structure of the light emitting layer differs). In the thus manufactured EL display device, only a part of the light emitting layer, where the electron transmitting regions 701a to 701d and the hole transmitting regions 801a to 801d are formed, emits light when a given voltage is applied to the light emitting layer.

Embodiment 7

Being a self-light emitting type, an EL display device fabricated by carrying out the present invention is superior to a liquid crystal display device in visibility in a bright place. The EL display device of the present invention thus has a wide variety of uses as a direct view type EL display. One of superior advantages EL displays to liquid crystal displays is wide view angle. Accordingly, EL displays are preferred in a use where a display of 30 inches or more in diagonal is required.

The EL display using the present invention is suitable as, for example, an electronic signboard (as opposed to painted signboard) for displaying still images or text information, such as a billboard, an emergency exit indicator, a clockface adapted for use in a dim place, a road sign for nighttime, and a display on a keyboard of a personal computer. These displays are better if they cost less as a product, and in that point the present invention suits very well.

According to the present invention, the patterning step is required only once to make it possible to manufacture an EL display device through a very small number of manufacturing steps. In other words, production cost of the EL display device can be reduced significantly.

The present invention also makes it possible to manufacture an EL display device of extremely high definition because the image display region can be determined through the patterning step that uses the resist. Therefore, employment of the EL display device of the present invention can realize at a low cost a display capable of displaying precisely text information, or the like, shown in small font.

What is claimed is:

1. An EL display device comprising an EL element including:
    an anode and a cathode; and
    a light emitting layer between the anode and the cathode,
    wherein the light emitting layer comprises at least a light emitting region and a non-light emitting region,
    wherein the light emitting region has a first portion that is defined as a portion in the light emitting layer adjacent to a first interface between the anode and the light emitting layer and a second portion that is defined as a portion in the light emitting layer adjacent to a second interface between the cathode and the light emitting layer,
    wherein an impurity is selectively added into at least one selected from the group consisting of the first portion and the second portion.

2. An EL display device comprising:
    a substrate comprising a first region and a second region;
    an anode, a cathode, and an EL layer between the anode and the cathode formed over the first region and the second region,
    wherein the EL layer comprises at least a first portion and a second portion over the second region,
    wherein a portion of the first portion comprises at least one impurity while the second portion comprises no impurity, and
    wherein the portion of the first portion is positioned in contact with at least one of a first interface between the anode and the EL layer and a second interface between the cathode and the EL layer.

3. A device according to claim 1,
    wherein the anode comprises a transparent conductive film while the cathode comprise a metallic film including an alkali metal element or an alkaline earth metal element.

4. A device according to claim 1,
    wherein the impurity added into the first portion is a halogen element while the impurity added into the second portion is one selected from the group consisting of an alkali metal element and a alkali earth metal element,
    wherein the halogen element is at least one selected from the group consisting of fluorine, chlorine, bromine and iodine, and
    wherein the alkali metal element is at least one selected from the group consisting of lithium, sodium, potassium and cesium, while the alkali earth metal element is at least one selected from the group consisting of beryllium, magnesium, calcium and barium.

5. A device according to claim 1,
    wherein the first portion act as a hole transmitting region while the second portion act as an electron transmitting region.

6. An electronic signboard in combination with the EL display device of claim 1,
    wherein the electronic signboard is one selected from the group consisting of a billboard, an emergency exit indicator, a clockface adapted for use in a dim place, a road sign for nighttime, and a display on a keyboard of a personal computer.

7. A device according to claim 1,
    wherein the light emitting layer comprises an EL layer comprising an organic material.

8. A device according to claim 1, wherein the first portion is in contact with the first interface while the second portion is in contact with the second interface.

9. An EL display device comprising an EL element including:
    an anode and a cathode; and
    a light emitting layer between the anode and the cathode,
    wherein at least one selected from the group consisting of an alkali metal element and an alkali earth metal element is selectively added into a portion in the light emitting layer adjacent to an interface between the cathode and the light emitting layer.

10. A device according to claim 9,
    wherein the alkali metal element is at least one selected from the group consisting of lithium, sodium, potassium and cesium, while the alkali earth metal element is at least one selected from the group consisting of beryllium, magnesium, calcium and barium.

11. A device according to claim 9,
    wherein the anode comprises a transparent conductive film while the cathode comprise a metallic film including an alkali metal element or an alkaline earth metal element.

12. A device according to claim 9,
    wherein the portion act as an electron transmitting region.

13. An electronic signboard in combination with the EL display device of claim 9,
    wherein the electronic signboard is one selected from the group consisting of a billboard, an emergency exit indicator, a clockface adapted for use in a dim place, a road sign for nighttime, and a display on a keyboard of a personal computer.

14. A device according to claim 9,
    wherein the light emitting layer comprises an EL layer comprising an organic material.

15. A device according to claim 9, wherein the portion is in contact with the interface.

16. An EL display device comprising an EL element including:
    an anode and a cathode; and
    a light emitting layer between the anode and the cathode,
    wherein a halogen element is selectively added into a first portion in the light emitting layer adjacent to a first interface between the anode and the light emitting layer, and wherein at least one selected from the group consisting of an alkali metal element and an alkali earth metal element is selectively added into a second portion in the light emitting layer adjacent to a second interface between the cathode and the light emitting layer.

17. A device according to claim 16, wherein the halogen element is at least one selected from the group consisting of fluorine, chlorine, bromine and iodine, and wherein the alkali metal element is at least one selected from the group consisting of lithium, sodium, potassium and cesium, while the alkali earth metal element is at least one selected from the group consisting of beryllium, magnesium, calcium and barium.

18. A device according to claim 16, wherein the anode comprises a transparent conductive film while the cathode comprise a metallic film including an alkali metal element or an alkaline earth metal element.

19. A device according to claim 16, wherein the first portion act as a hole transmitting region while the second portion act as an electron transmitting region.

20. An electronic signboard in combination with the EL display device of claim 16, wherein the electronic signboard is one selected from the group consisting of a billboard, an emergency exit indicator, a clockface adapted for use in a dim place, a road sign for nighttime, and a display on a keyboard of a personal computer.

21. A device according to claim 16, wherein the light emitting layer comprises an EL layer comprising an organic material.

22. A device according to claim 16, wherein the first portion is in contact with the first interface while the second portion is in contact with the second interface.

23. An EL display device comprising an EL element including:

an anode and a cathode; and an EL layer between the anode and the cathode, wherein a first portion in the EL layer is positioned in contact with a first interface between the anode and the EL layer while a second portion in the EL layer is positioned in contact with a second interface between the cathode and the EL layer, wherein at least one of a portion of the first portion and a portion of the second portion comprises an impurity.

24. A device according to claim 23, wherein the EL layer comprises a light emitting layer.

25. A device according to claim 23, wherein the impurity is at least one selected from the group consisting of fluorine, chlorine, bromine and iodine, and added into the portion of the first portion.

26. A device according to claim 23, wherein the impurity is at least one selected from the group consisting of lithium, sodium, potassium, cesium, beryllium, magnesium, calcium and barium, and added into the portion of the second portion.

27. An EL display device comprising an EL element including:

an anode and a cathode; and a light emitting layer between said anode and cathode, wherein a halogen element is selectively added into a portion in the light emitting layer adjacent to an interface between the anode and the light emitting layer.

28. A device according to claim 27, wherein the anode comprises a transparent conductive film while the cathode comprise a metallic film including an alkali metal element or an alkaline earth metal element.

29. A device according to claim 27, wherein the portion act as a hole transmitting region.

30. An electronic signboard in combination with the EL display device of claim 27, wherein the electronic signboard is one selected from the group consisting of a billboard, an emergency exit indicator, a clockface adapted for use in a dim place, a road sign for nighttime, and a display on a keyboard of a personal computer.

31. A device according to claim 27, wherein the light emitting layer comprises an EL layer comprising an organic material.

32. A device according to claim 27, wherein the portion is in contact with the interface.

33. A device according to claim 27, wherein the halogen element is at least one selected from the group consisting of fluorine, chlorine, bromine and iodine.

34. A device according to claim 2, wherein the EL layer comprises a light emitting layer.

35. A device according to claim 2, wherein the impurity is at least one selected from the group consisting of fluorine, chlorine, bromine and iodine, and the portion of the first portion is positioned in contact with the first interface.

36. A device according to claim 2, wherein the impurity is at least one selected from the group consisting of lithium, sodium, potassium, cesium, beryllium, magnesium, calcium and barium, and the portion of the first portion is positioned in contact with the second interface.

37. An EL display device comprising:

a substrate comprising a first region and a second region:

an anode, a cathode, and an EL layer between the anode and the cathode formed over the first region and the second region, wherein the EL layer comprises at least a first portion over the first region and a second portion over the second region, wherein a portion of the first portion comprises at least one impurity while the second portion comprises no impurity, wherein the portion of the first portion is positioned in contact with at least one of a first interface between the anode and the EL layer and a second interface between the cathode and the EL layer, and wherein only the first portion emits light.

38. A device according to claim 37, wherein the EL layer comprises a light emitting layer.

39. A device according to claim 37, wherein the impurity is at least one selected from the group consisting of fluorine, chlorine, bromine and iodine, and the portion of the first portion is positioned in contact with the first interface.

40. A device according to claim 37, wherein the impurity is at least one selected from the group consisting of lithium, sodium, potassium, cesium, beryllium, magnesium, calcium and barium, and the portion of the first portion is positioned in contact with the second interface.

* * * * *